United States Patent
Kim

(10) Patent No.: US 10,762,842 B2
(45) Date of Patent: Sep. 1, 2020

(54) CONTROLLER, DISPLAY DEVICE AND METHOD FOR CONTROLLING TO REDUCE DEGRADATION OF IMAGE QUALITY WITH USE

(71) Applicant: LG Display Co., Ltd., Seoul (KR)

(72) Inventor: JinUk Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 48 days.

(21) Appl. No.: 15/853,320

(22) Filed: Dec. 22, 2017

(65) Prior Publication Data

US 2019/0027095 A1    Jan. 24, 2019

(30) Foreign Application Priority Data

Jul. 24, 2017   (KR) .......................... 10-2017-0093759

(51) Int. Cl.
  *G09G 3/30*    (2006.01)
  *G09G 3/3258*  (2016.01)
  *H01L 51/52*   (2006.01)
  *G09G 3/3233*  (2016.01)
  *G09G 3/3291*  (2016.01)
  *H01L 27/32*   (2006.01)
  *G09G 3/00*    (2006.01)

(52) U.S. Cl.
  CPC ......... *G09G 3/3258* (2013.01); *G09G 3/3233* (2013.01); *G09G 3/3291* (2013.01); *H01L 51/5203* (2013.01); *G09G 3/006* (2013.01); *G09G 2300/0819* (2013.01); *G09G 2300/0842* (2013.01); *G09G 2310/0251* (2013.01); *G09G 2310/0264* (2013.01); *G09G 2320/0295* (2013.01); *G09G 2320/041* (2013.01); *H01L 27/3225* (2013.01)

(58) Field of Classification Search
  CPC .. G09G 3/3225; G09G 3/3258; G09G 3/3233; G09G 3/3291; G09G 3/006; H01L 27/3225; H01L 51/5203
  USPC .......................................................... 345/76
  See application file for complete search history.

(56) References Cited

U.S. PATENT DOCUMENTS

| | | | |
|---|---|---|---|
| 9,076,387 B1 * | 7/2015 | Lee ...................... | G09G 3/3233 |
| 2014/0084792 A1 * | 3/2014 | Oh ....................... | G09G 3/3208 315/120 |
| 2014/0176525 A1 * | 6/2014 | Woo ..................... | G09G 3/3233 345/212 |
| 2014/0176622 A1 * | 6/2014 | Jung .................... | G09G 3/3208 345/690 |

(Continued)

*Primary Examiner* — Adam J Snyder
(74) *Attorney, Agent, or Firm* — Seed IP Law Group LLP

(57) ABSTRACT

The present embodiments may provide a display device that includes a display panel; a data driver configured to include a plurality of driver Integrated Circuits (ICs) configured to supply a data signal to the display panel and to be present on the display panel, and to have a first characteristic and a second characteristic corresponding to variation between at least two driver ICs among the plurality of driver ICs; and a controller configured to supply a first voltage and a second voltage to the data driver, to identify change values of the first characteristic and the second characteristic corresponding to the first voltage and the second voltage, and to change the first characteristic and the second characteristic corresponding to the change values, and may provide a method for operating the same.

20 Claims, 9 Drawing Sheets

(56) References Cited

U.S. PATENT DOCUMENTS

2016/0111042 A1* 4/2016 Pyeon .................. G09G 3/3208
                                                          345/212
2016/0189615 A1* 6/2016 Kwon et al. ......... G09G 3/3258
                                                          345/214

* cited by examiner

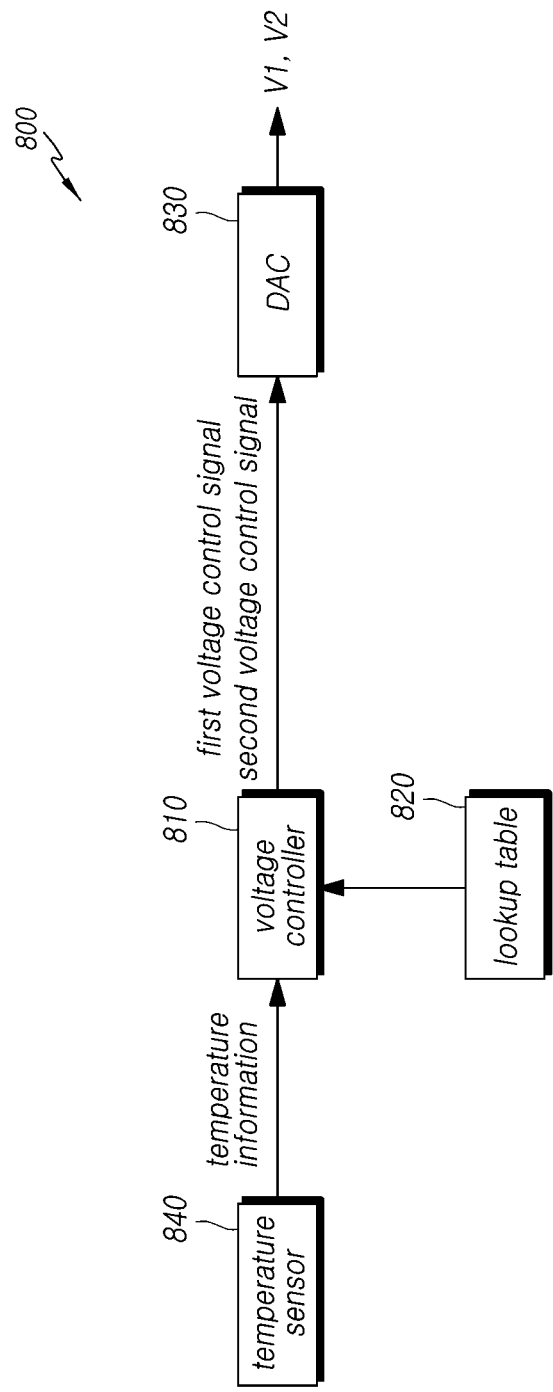

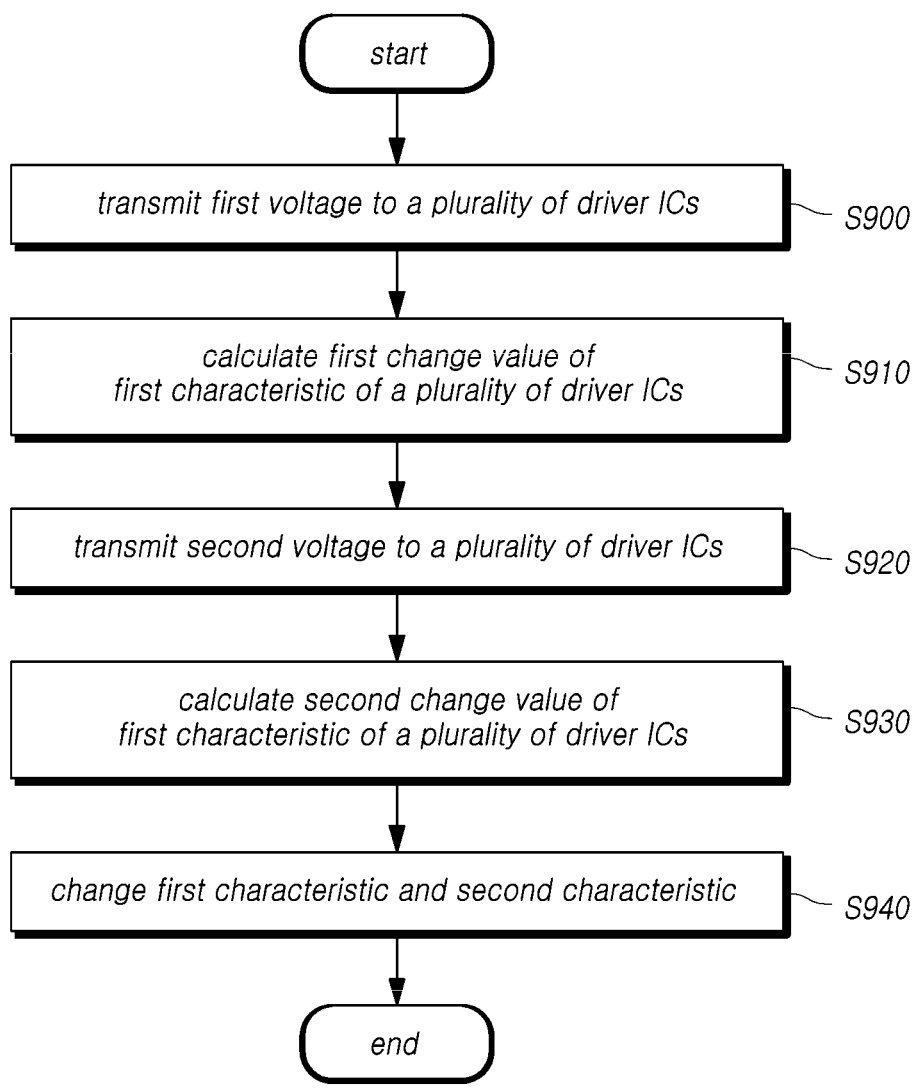

CONTROLLER, DISPLAY DEVICE AND METHOD FOR CONTROLLING TO REDUCE DEGRADATION OF IMAGE QUALITY WITH USE

CROSS REFERENCE TO RELATED APPLICATION

This application claims priority from Korean Patent Application No. 10-2017-0093759, filed on Jul. 24, 2017, which is hereby incorporated by reference for all purposes as if fully set forth herein.

BACKGROUND

Technical Field

The present embodiments relate to a controller, a display device, and a method for controlling the same.

Description of the Related Art

With the development of the information-oriented society, there is growing demand for display devices for displaying images in various forms, and accordingly, different types of display devices, such as a Liquid Crystal Display (LCD) device, a Plasma Display Panel (PDP), and an Organic Light-Emitting Display (OLED) device, have been used.

Among these display devices, an active-matrix OLED device having characteristics of being thin and having a light weight, an excellent viewing angle, and an excellent contrast ratio is widely used. The OLED device may display an image when a data driver applies a data signal to a pixel in response to a gate signal.

The OLED device may have variations in threshold voltages of organic light-emitting diodes and/or driving transistors in the manufacturing process thereof, and the organic light-emitting diodes and/or the driving transistors may deteriorate with use, thus causing the degradation of image quality. Therefore, it is required to prevent variation in threshold voltage in the OLED device and deterioration of the organic light-emitting diodes and/or the driving transistors.

To this end, the OLED device may need to sense a voltage corresponding to a driving current flowing in the organic light-emitting diodes and to compensate for a digital signal using a compensation algorithm for compensating for variation in threshold voltage and deterioration of the organic light-emitting diodes and/or the driving transistors in response to the sensed value, thereby preventing the degradation of image quality. Further, the sensed value may vary depending on the time of use, and accordingly variation in luminance may occur depending on the period of use.

Therefore, it is necessary to detect variation in threshold voltage and deterioration of the organic light-emitting diodes and/or the driving transistors and to compensate for variation in sensed values that may occur depending on the time of use.

BRIEF SUMMARY

An aspect of the present embodiments is to provide a controller, a display device, and a method for controlling the same, which are capable of preventing the degradation of image quality with use.

Another aspect of the present embodiments is to provide a controller, a display device, and a method for controlling the same, which are capable of accurately calculating variation between driver Integrated Circuits (ICs).

In accordance with an aspect of the present embodiments, there is provided a display device including: a display panel; a data driver configured to include a plurality of driver Integrated Circuits (ICs) configured to supply a data signal to the display panel and to be present on the display panel, and to have a first characteristic and a second characteristic corresponding to variations between at least two driver ICs among the plurality of driver ICs; and a controller configured to supply a first voltage and a second voltage to the data driver, to identify change values of the first characteristic and the second characteristic corresponding to the first voltage and the second voltage, and to change the first characteristic and the second characteristic corresponding to the change values.

In accordance with another aspect of the present embodiments, there is provided a display device including: a display panel; a data driver configured to include a plurality of driver ICs configured to supply a data signal to the display panel, and to have a first characteristic and a second characteristic set corresponding to variation between at least two driver ICs among the plurality of driver ICs; and a controller configured to operate in divided periods of a first detection period for detecting a first change value of the first characteristic and a second detection period for detecting a second change value of the first characteristic, which is performed after the first detection period expires, and to change and set the first characteristic and the second characteristic using the first change value and the second change value.

In accordance with still another aspect of the present embodiments, there is provided a controller including: a voltage supply unit configured to sequentially supply a first voltage and a second voltage to a plurality of driver ICs when a pixel-driving period expires; and a characteristic change unit configured to identify change values of a first characteristic and a second characteristic corresponding to variations of the plurality of driver ICs using a first digital signal and a second digital signal, which are transmitted from the plurality of driver ICs corresponding to the first voltage and the second voltage, and to change the first characteristic and the second characteristic using the change values.

In accordance with yet another aspect of the present embodiments, there is provided a control method for changing variations of a plurality of driver ICs that transmits a data signal to a display panel including a plurality of pixels, the control method including: transmitting a first voltage to the plurality of driver ICs; calculating a first change value of a first characteristic of the plurality of driver ICs corresponding to a signal output from the plurality of driver ICs; transmitting a second voltage to the plurality of driver ICs; detecting a second change value of the first characteristic corresponding to a signal output from the plurality of driver ICs; and changing and setting the first characteristic and the second characteristic using the first change value and the second change value.

According to the present embodiments, there may be provided a controller, a display device, and a method for controlling the same, which are capable of preventing the degradation of image quality with use.

According to the present embodiments, there may be provided a controller, a display device, and a method for controlling the same, which are capable of accurately calculating variation between driver ICs.

BRIEF DESCRIPTION OF THE SEVERAL VIEWS OF THE DRAWINGS

The above and other objects, features and advantages of the present disclosure will be more apparent from the following detailed description taken in conjunction with the accompanying drawings, in which:

FIG. 8 is a structural view illustrating a second example of the voltage supply unit illustrated in FIG. 6; and FIG. 9 is a flowchart illustrating a control method for controlling the display device illustrated in FIG. 1.

DETAILED DESCRIPTION

Figure 1:
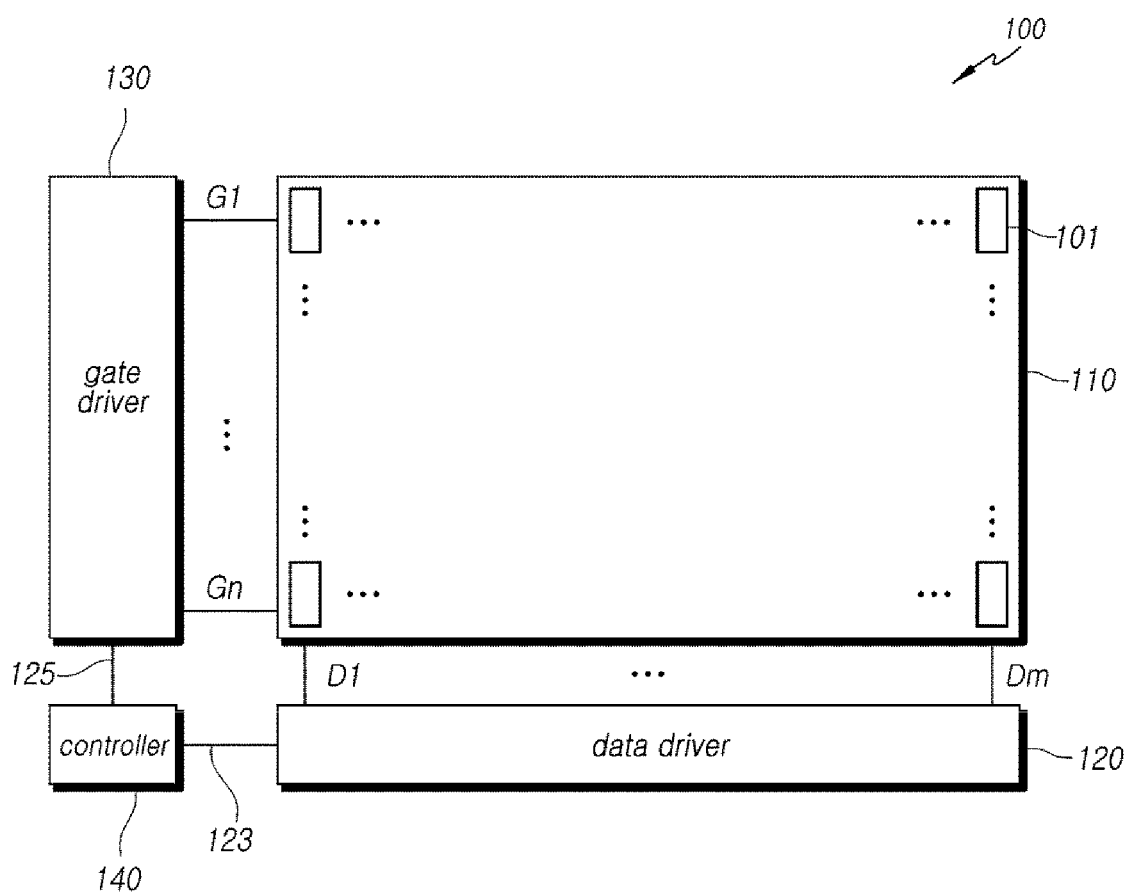
FIG. 1 is a structural view illustrating one example of a display device according to the present embodiment.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a structural view illustrating one example of a display device according to the present embodiment.

Referring to FIG. 1, the display device 100 may include a display panel 110, a data driver 120, a gate driver 130, and a controller 140. Bus 123 comprising many signal lines connects the controller to the data driver 120 and bus 125 comprising many signal lines connects the controller to the gate driver 130. In one embodiment, bus 123 and bus 125 are two way buses.

A plurality of pixels 101 may be disposed on the display panel 110. The plurality of pixels 101 may be driven by receiving a data signal and a gate signal and may express a grayscale value corresponding to the voltage level of the data signal. The plurality of pixels 101 can emit red, blue, and green light, respectively. In some embodiments, there is a pixel 101 that emits white light. However, the color of light emitted from the pixels 101 is not limited thereto.

Data lines D1 to Dm for transmitting data signals to the plurality of pixels 101 and gate lines G1 to Gn for transmitting gate signals thereto may cross on the display panel 110, and the plurality of pixels 101 may be connected to the data lines D1 to Dm and the gate lines G1 to Gn. The wires disposed on the display panel 110 are not limited to the data lines D1 to Dm and the gate lines G1 to Gn.

Figure 5:
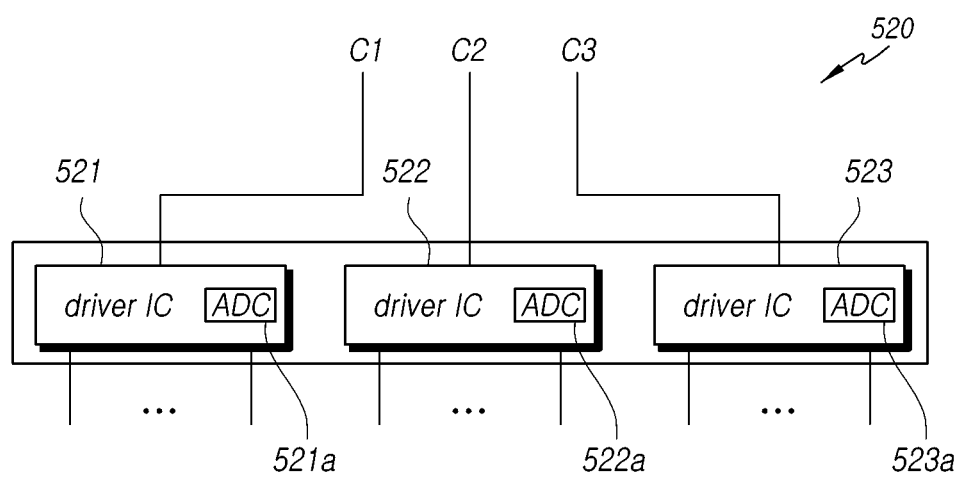
FIG. 5 is a structural view illustrating one example of a data driver illustrated in FIG. 1.

The data driver 120 may include a plurality of driver ICs (not shown FIG. 1, but see FIG. 5). Each driver IC can receive a digital data signal and can simultaneously output a plurality of analog data signals through the data lines D1 to Dm. The number of driver ICs included in the data driver 120 may be determined depending on the resolution of the display panel 110. Each of the plurality of driver ICs may include an Analog-to-Digital Converter (ADC, not shown in FIG. 1, but see FIG. 5).

The gate driver 130 can be driven to sequentially transmit gate signals to the gate lines G1 to Gn. Here, the gate driver 130 is shown as a separate component that is different from the display panel 110, but is not limited thereto. The gate driver may be formed as a Gate-In-Panel (GIP) circuit and may be disposed in one area of the display panel 110. The gate driver 130 is shown as being disposed on one side of the display panel 110, but is not limited thereto.

The data driver 120 and the gate driver 130 may each be connected to the display panel 110 through a Printed Circuit Board (PCB).

The controller 140 may output respective control signals for controlling the data driver 120 on bus 123 and the gate driver 130 on bus 125. In addition, the controller 140 may transmit a digital data signal to the data driver 120 and bus 123. The controller 140 may receive an image signal from the outside, may convert the image signal into a digital data signal, and may transmit the digital data signal that is supplied to the respective ICs in the data driver 120.

With growing demand for display devices having a larger size and higher resolution in recent years, a greater number of driver ICs are needed for a data driver 120. An increase in the number of driver ICs also causes an increase in the number of ADCs that sense voltage. Since the output of the ADCs varies, digital signals output from the ADCs employed in one display device 100 may output variable sensing results due to the output variation. Therefore, the sensing result of the deterioration of an organic light-emitting diode or a driving transistor and/or variations in threshold voltage may not be accurately reflected. As a result, image quality degradation may occur due to the luminance variation of the display device 100.

The image quality degradation can be to be solved by compensating for the sensing result in response to the output variations using information on the output variations between the ADCs. Also, since the output variations of the ADCs may be changed due to deterioration with use, signals outputted from the ADCs may not accurately reflect the deterioration of the organic light-emitting diode and/or the driving transistor due to a change in the output variations with the use of the display device, thus degrading the image quality of the display device 100 with use.

Therefore, according the current disclosure, the controller 140 may identify a change value of the output variations between the ADCs, which changes in response to the deterioration. The controller 140 can output a modified change value to respond to a changed characteristic of the ADCs, thereby preventing the degradation of image quality. In addition, the controller 140 may receive signals from the ADCs of the driver ICs and bus 123 and may allow the change value signals to respond to respective variations between the ADCs included in the plurality of driver ICs.

Figure 2:
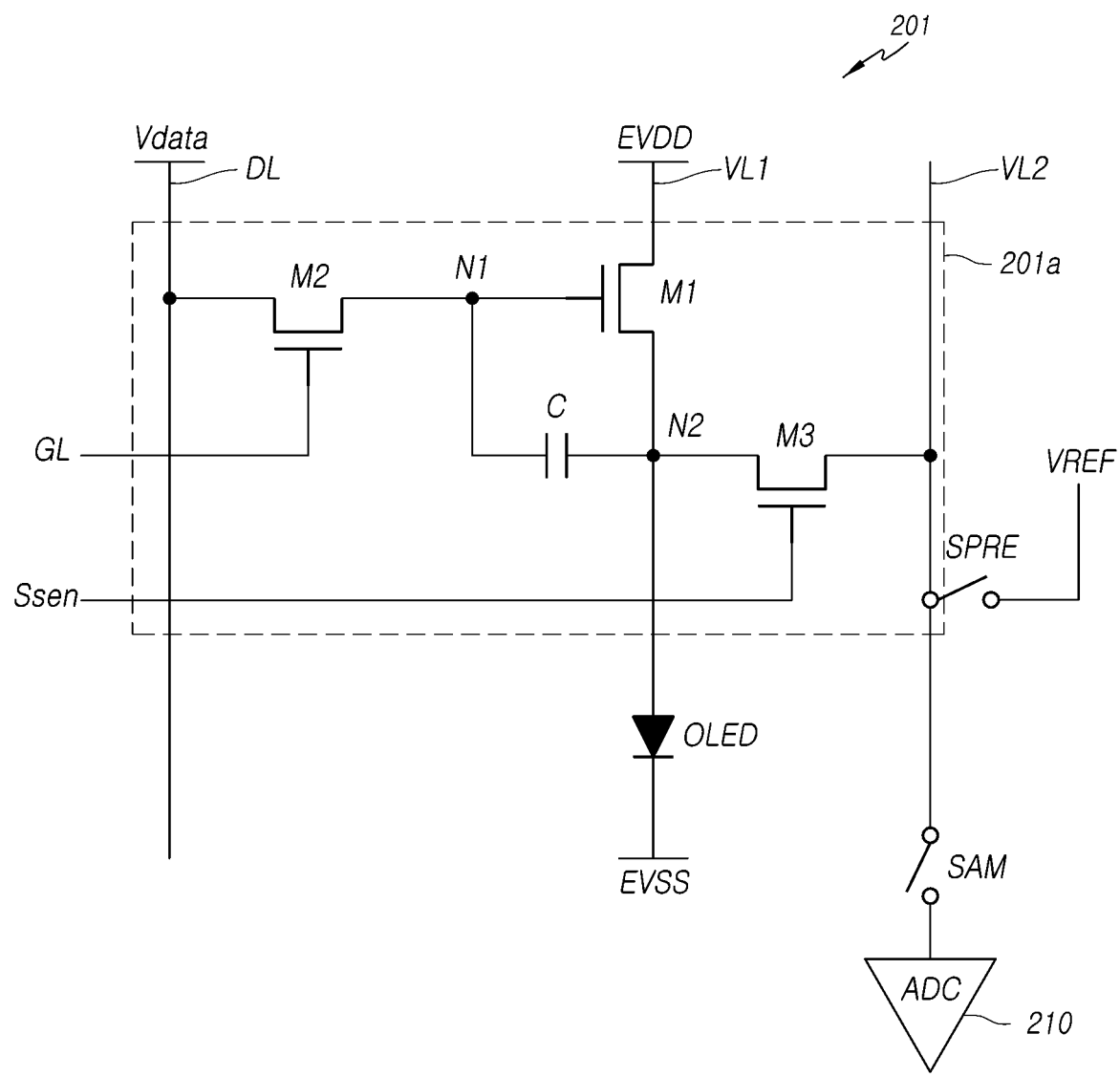
FIG. 2 is a circuit diagram illustrating one example of a pixel employed for a display panel illustrated in FIG. 1.

FIG. 2 is a circuit diagram illustrating one example of the pixel illustrated in FIG. 1.

Referring to FIG. 2, the pixel 201 may include an Organic Light-Emitting Diode (OLED) and a pixel circuit 201a.

The OLED can emit light by a driving current flowing corresponding to the voltage of an anode electrode and the voltage of a cathode electrode. The anode electrode of the OLED may be connected to a second node N2 and the cathode electrode thereof may be connected to a low potential voltage EVSS. The OLED may include an organic layer (not shown) and may emit red, green, and blue light corresponding to the organic layer. However, the OLED is not limited thereto.

The pixel circuit 201a may transmit a driving current to the OLED. In the pixel circuit 201a, a data line DL, a first power supply line VL1, a second power supply line VL2, a gate line GL, and a sensing line Ssen may be connected to a first transistor M1, a second transistor M2, a third transistor M3, and a capacitor C. The first transistor M1 may be a driving transistor that generates a driving signal corresponding to a data voltage Vdata corresponding to a data signal. The pixel circuit 201a may include a first switch SAM that connects the second power supply line VL2 with an ADC 210 and a second switch SPRE that connects the second power supply line VL2 with a reference voltage VREF.

The first transistor M1 includes: a first electrode that may be connected to the first power supply line VL1 for transmitting a high potential voltage EVDD; a gate electrode that may be connected to a first node N1; and a second electrode that may be connected to the second node N2. The second node N2 may be connected to the anode electrode of the OLED. The first transistor M1 may allow a driving current to flow from the first electrode to the second electrode corresponding to a data voltage Vdata transmitted to the first node N1. The magnitude of the driving current may be determined based on a voltage difference between the gate electrode and the second electrode. Here, although not limited thereto, the first electrode may be a drain electrode of the first transistor M1 and the second electrode may be a source electrode thereof.

The second transistor M2 includes: a first electrode that may be connected to the data line DL for transmitting a data voltage Vdata; a second electrode that may be connected to the first node N1; and a gate electrode that may be connected to the gate line GL. The second transistor M2 may allow the data voltage, transmitted through the data line DL in response to a gate signal transmitted through the gate line GL, to be transmitted to the first node N1.

The third transistor M3 includes: a first electrode that may be connected to the second power supply line VL2; a second electrode that may be connected to the second node N2; and a gate electrode that may be connected to the sensing line Ssen. The third transistor M3 may transmit the voltage of the second node N2 to the second power supply line VL2 in response to a sensing signal transmitted through the sensing line Ssen.

The capacitor C is disposed between the first node N1 and the second node N2 and can maintain the voltage of the first node N1 corresponding to a voltage stored in the capacitor C. The capacitor C may store a voltage corresponding to a data voltage in the first node N1.

In the pixel circuit 201a, the second power supply line VL2 may be connected to the ADC 210 via the first switch SAM. The ADC 210 may receive the voltage of the second node N2 and may detect deterioration information on the first transistor M1 and/or the OLED.

Although the pixel circuit 201a is shown as including the first to third transistors M1 to M3 and one capacitor C, this configuration is merely an example. The pixel circuit 201a is not limited thereto.

Figure 3:
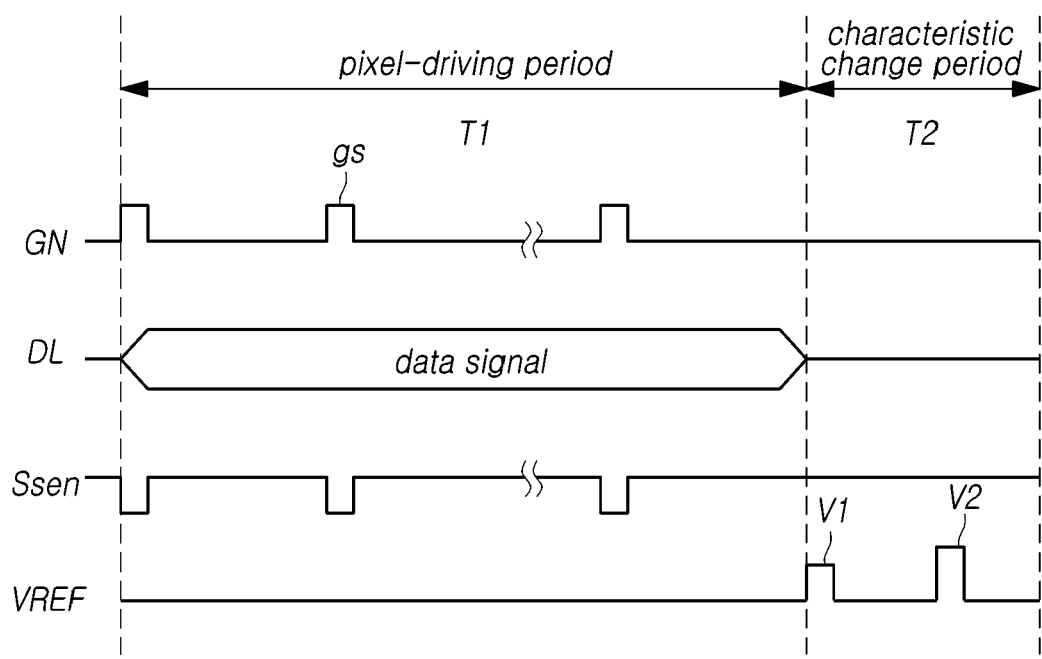
FIG. 3 is a waveform diagram illustrating one example of a signal supplied to the pixel illustrated in FIG. 2.

FIG. 3 is a waveform diagram illustrating one example of a signal supplied to the pixel illustrated in FIG. 2.

Referring to FIG. 3, the pixel 201 may operate in divided periods of a pixel-driving period T1 and a characteristic change period T2. The pixel-driving period T1 may be a period in which the pixel 201 is supplied with a voltage to generate a driving current, and the characteristic change period T2 may be a period that starts after the pixel-driving period T1 expires and in which information on characteristic variations between the ADCs 210 is obtained. The characteristic change period T2 may be maintained for a certain period of time after the pixel-driving period T1 expires. The pixel-driving period T1 may be a period in which the display device displays an image. However, the pixel-driving period T1 is not limited thereto.

In the pixel-driving period T1, the pixel circuit 201a may generate a driving current. Further, the driving current generated in the pixel circuit 201a may be transmitted to the OLED to emit light, thus expressing a grayscale value. However, the present embodiment is not limited thereto.

In the pixel-driving period T1, a gate signal gs may be transmitted to the gate line GL, so that the second transistor M2 may be turned on. When the second transistor M2 is turned on, the data voltage Vdata transmitted to the data line DL may be transmitted to the first node N1. When the data voltage Vdata is transmitted to the first node N1 through the data line DL, the capacitor C may maintain a voltage corresponding to the data voltage Vdata. Also, the first transistor M1 may allow the driving current to flow from first power EVDD to second power EVSS corresponding to the voltage of the first node N1.

Further, the third transistor M3 may be turned on by a sensing signal Sense transmitted through the sensing line Ssen. Also, the first switch SAM connected to the second power supply line VL2 may be turned on. When the first switch SAM is turned on, the voltage of the second node N2 may be transmitted to the ADC 210 through the second power supply line VL2. Upon receiving the voltage of the second node N2, the ADC 210 may detect information on the deterioration of the OLED or the first transistor M1. When the ADC 210 transmits a change signal including the information on the deterioration of the OLED or the first transistor M1 to the controller 140 shown in FIG. 1, a data signal may be changed in accordance with the deterioration, variation in threshold voltage, or the like.

In the characteristic change period T2, the second transistor M2 and the third transistor M3 are turned off. The characteristic change period T2 may be a period that continues for a predetermined period of time after a user stops using the display device. That is, the characteristic change period T2 may be a period that starts when the display panel 110 stops operating and displays nothing. In the characteristic change period T2, the first switch SAM and the second switch SPRE may be turned on.

When the first switch SAM and the second switch SPRE are turned on, the ADC 210 may sequentially receive a first voltage V1 and a second voltage V2 through the second power supply line VL2. The ADC 210 may output a first digital signal corresponding to the first voltage V1 upon receiving the first voltage V1, and may output a second digital signal corresponding to the second voltage V2 upon receiving the second voltage V2. It is shown that the first voltage V1 and the second voltage V2 occur once in the characteristic change period T2, but this is merely an example. The first voltage V1 and the second voltage V2 may each occur multiple times in the characteristic change period T2.

Figure 4:
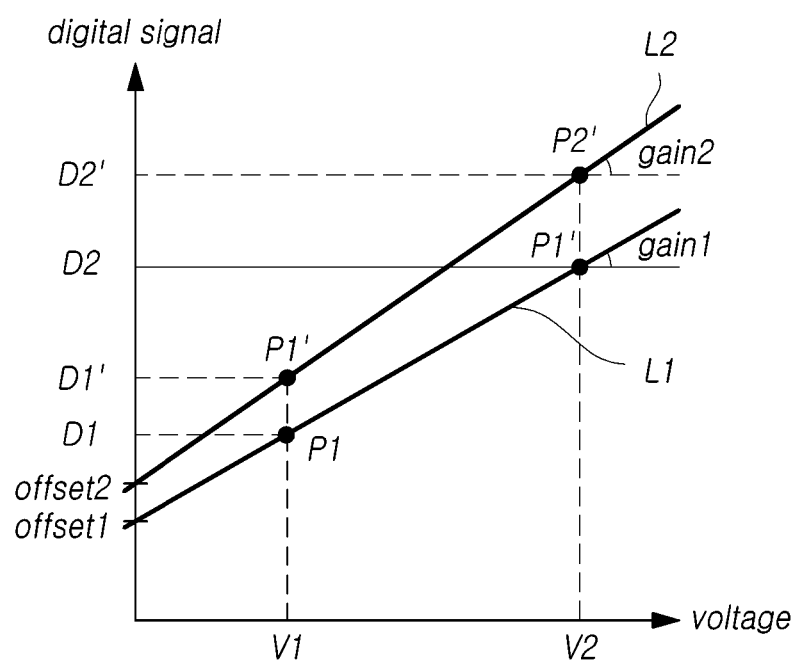
FIG. 4 is a graph illustrating the concept of a first characteristic and a second characteristic of an ADC illustrated in FIG. 2.

The digital signals output from the ADC 210 may be represented in a graph, as illustrated in FIG. 4. FIG. 4 is a graph illustrating the concept of a first characteristic and a second characteristic of the ADC illustrated in FIG. 2.

Referring to FIG. 4, the relationship between a voltage input to the ADC 210 and output data output from the ADC 210 may be represented by a straight line having a constant slope. Since the relationship between the input voltage of the ADC 210 and the output data output from the ADC 210 may be linear, a straight line corresponding to a first digital signal D1 and a second digital signal D2 respectively corresponding to a first voltage V1 and a second voltage V2 may be similar to a straight line indicating the relationship of digital signals output from the ADC 210 by receiving voltages within a predetermined range.

Further, the characteristics of the ADC 210 may be represented by an offset and gain, and the ADCs 210 may each have variations in offset and gain. That is, the plurality of ADCs 210 may have different offsets and different gains, respectively, and thus may output different digital signals even if the ADCs 210 receive the same input voltage. Therefore, each of the ADCs 210 is made to operate in consideration of variation in offset and gain, thereby preventing degradation of image quality caused by such variation in offset and gain. Here, offset may be referred to as a first characteristic and gain may be referred to as a second characteristic.

To this end, information on the offsets and gains of all ADCs 210 connected to the pixel may be set. The information on the offsets and gains may be set by operating each ADC 210 and identifying an output signal relative to an input signal. After the information on the offsets and gains of all the ADCs 210 connected to the pixel 201 is obtained, information on the average offset and the average gain is calculated, thereby setting information on an offset and gain.

The average offset and the average gain may be obtained by setting the offset and the gain of each ADC 210 and averaging the offsets and the gains of the respective ADCs 210. The average offset and the average gain may be obtained by setting different offsets and different gains respectively for a plurality of channels included in each ADC 210 and averaging the offsets and gains of the respective channels.

For example, when the display device is an Ultra-High-Definition (UHD) device, the display device may include 20 driver ICs in total, each of which includes an ADC 210. Thus, the display device needs 20 ADCs in total. Since each ADC 210 includes 192 channels, the number of channels required for the display device is 3840 in total. The average offset and the average gain may be obtained by averaging a total of 3840 offsets and a total of 3840 gains.

Further, the average offset and the average gain may be obtained by averaging offsets and gains that are acquired by repeatedly supplying the first voltage V1 and the second voltage V2 ten times and repeating the calculation ten times through 3840 channels in total.

When the display device is used, the ADC 210 may be made to operate in consideration of the information on the average offset and the average gain, thereby preventing the occurrence of image quality degradation caused by variation between the ADCs 210. Here, the relationship between the average offset and the average gain may be represented by a straight line 1 (L1).

When the display device is continuously used, deterioration may occur in the ADC 210. The levels of the offset and the gain of each ADC 210 may be changed by the deterioration. Thus, the initially set offset and gain are changed, and accordingly, the relationship between the average offset and the gain of each ADC 210 may be represented by a straight line 2 (L2). As a result, the initially set average offset and gain corresponding to the straight line 1 (L1) may become inaccurate upon long-term use of the display device. Namely, either just the offset can change or just the gain can change or both the offset and the gain can change over time.

To solve the foregoing problem, it is possible to update the average offset and the average gain by calculating an offset and gain in the change period T2. The display device may operate the ADC 210 in accordance with the updated average offset and gain when displaying an image, thereby preventing the occurrence of image quality degradation caused by deterioration.

Here, the difference between the first digital signal D1 output from the ADC 210 based on the first voltage V1 before the occurrence of deterioration and a first-1 digital signal D1' output from the ADC 210 based on the first voltage V1 in the change period T2 after the occurrence of deterioration may be referred to as a first change value, and the difference between the second digital signal D2 output from the ADC 210 based on the second voltage V2 before the occurrence of deterioration and a second-1 digital signal D2' output from the ADC 210 based on the second voltage V2 in the change period T2 after the occurrence of deterioration may be referred to as a second change value. The first digital signal D1 based on the first voltage V1 and the second digital signal D2 output from the ADC 210 before the occurrence of deterioration may be signals output from the ADC 210 before the update, and the first-1 digital signal D1' based on the first voltage V1 and the second-1 digital signal D2' output from the ADC 210 in the change period T2 after the occurrence of deterioration may be signals output from the ADC 210 after the update.

The first change value and the second change value may be used to identify a first point P1' and a second point P2', and the first point P1' and the second point P2' may be used to obtain a changed offset and gain. Here, the offset may correspond to a point at which the straight line 1 (L1) or the straight line 2 (L2) meets the Y-axis, and the gain may correspond to the slope of the straight line 1 (L1) or the straight line (L2). When the offset is changed only using the first voltage V1 in the change period, a changed offset may be identified, on the assumption that the slope is not changed, using the digital signal corresponding to the initial first voltage V1 and the digital signal corresponding to the first voltage V1 in the change period.

However, when the ADC 210 is actually deteriorated, an offset 1 and a gain 1 of the straight line 1 (L1) are different from an offset 2 and a gain 2 of the straight line 2 (L2). Therefore, when one voltage is used to identify a change in the variations of the ADC 210, an offset and gain depending on the changed variations of the ADC 210 may not be accurately calculated.

However, when the first voltage V1 and the second voltage V2 having a voltage level different from that of the first voltage V1 are used to detect the variation, both the offset and the gain can be identified, thus accurately calculating the characteristic variation of the ADC 210.

FIG. 5 is a structural view illustrating one example of the data driver illustrated in FIG. 1.

Referring to FIG. 5, the data driver 520 may include a plurality of driver ICs 521, 522, and 523. The data driver 520 corresponds to the data driver 120 of FIG. 1 in one embodiment. The plurality of driver ICs 521, 522, and 523 may receive a signal respectively through wires C1, C2, and C3 connected to the controller and are part of bus line 123. The plurality of driver ICs 521, 522, and 523 may further include ADCs 521a, 522a, and 523a that receive analog signals from the pixel circuits and output digital signals, respectively. The ADCs 521a, 522a and 523a may correspond to the ADC 210 illustrated in FIG. 2.

Here, the number of the plurality of driver ICs 521, 522, and 523 is shown to be three, but is not limited thereto. The plurality of driver ICs 521, 522, and 523 can detect the deterioration of the driving transistor and/or the OLED and variations in threshold voltage using the ADCs 521a, 522a, and 523a. Since the plurality of ADCs 521a, 522a and 523a is used, it is necessary to compensate for characteristic variations between the ADCs 521a, 522a and 523a. To this end, it is required to calculate and use the average value of the characteristic variations, thereby preventing the degradation of image quality that may be caused by a change in characteristic variations due to the deterioration of the ADCs 521a, 522a, and 523a.

Figure 6:
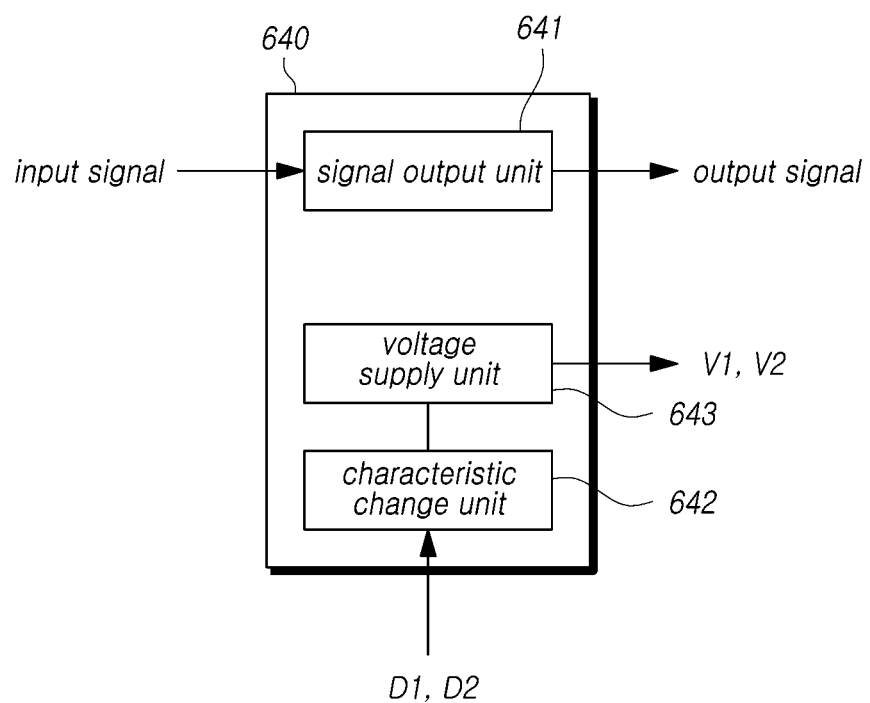
FIG. 6 is a structural view illustrating one example of a controller illustrated in FIG. 1.

FIG. 6 is a structural view illustrating one example of the controller 140 illustrated in FIG. 1.

Referring to FIG. 6, the controller 640 may include a voltage supply unit 643 that supplies a first voltage and a second voltage to a plurality of driver ICs, and a characteristic change unit 642 that identifies the change values of a first characteristic and a second characteristic corresponding to the variations of ADCs corresponding to the first voltage and the second voltage supplied to the ADCs and changes the first characteristic and the second characteristic.

The voltage supply unit 643 may supply the first voltage V1 in parallel to all the driver ICs 521, 522, and 523 illustrated in FIG. 5 and may then supply the second voltage V2 thereto in parallel again. The ADCs 521a, 522a, and 523a included in the driver ICs 521, 522, and 523 may output a first digital signal D1 upon receiving the first voltage V1 and may output a second digital signal D2 upon receiving the second voltage V2. The voltage supply unit 643 may repeatedly supply the first voltage V1 and the second voltage V2 a plurality of times, thereby calculating the average value of the first digital signal D1 and the second digital signal D2.

The characteristic change unit 642 may identify the change values of the first characteristic and the second characteristic of the ADCs 521a, 522a, and 523a in response to variation using the first digital signal D1 and the second digital signal D2. The characteristic change unit 642 may store the initial first characteristic and the initial second characteristic and may compare the stored first characteristic and second characteristic with the first digital signal D1 and the second digital signal D2, which are generated using the first voltage V1 and the second voltage V2, to identify the change values of the first characteristic and the second characteristic. Here, the first characteristic may be an offset, and the second characteristic may be gain. The characteristic change unit 642 may identify the two specific points P1' and P2' illustrated in FIG. 4 using the first voltage V1 and the first digital signal D1 and using the second voltage V2 and the second digital signal D2 and may identify a straight line by the two specific points P1' and P2', thereby identifying the first characteristic and the second characteristic.

Also, the controller 640 may include a signal output unit 641 that receives and outputs signals. A signal input to the signal output unit 641 may include RGB image signals and a clock signal. However, the signal input to the signal output unit 641 is not limited thereto. In addition, a signal output from the signal output unit 641 may include a digital data signal, a data-driver control signal, and a gate-driver control signal. However, the signal output from the signal output unit 641 is not limited thereto. A digital data signal outputted from the signal output unit 641 may be changed in response to an offset and gain identified by the characteristic change unit 642. However, the present embodiment is not limited thereto.

Figure 7:
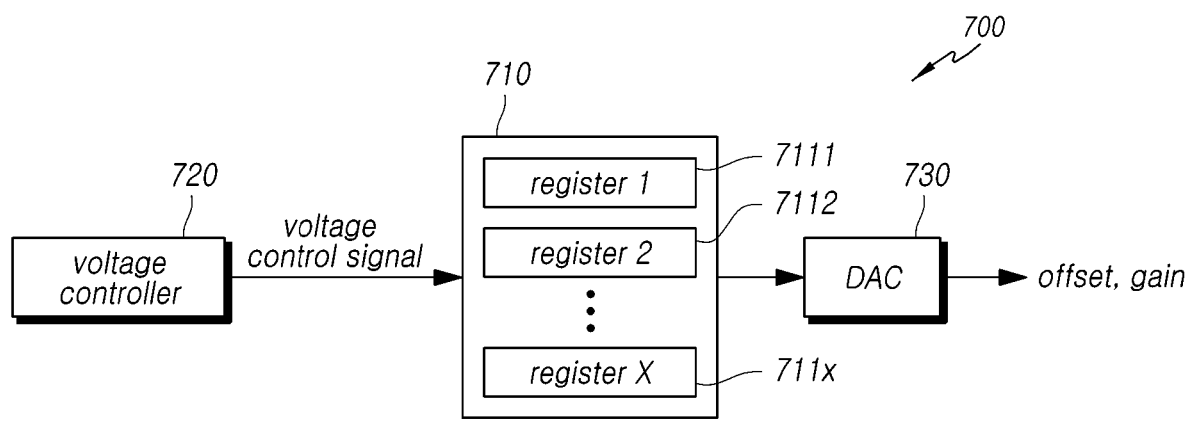
FIG. 7 is a structural view illustrating a first example of a voltage supply unit illustrated in FIG. 6.

FIG. 7 is a structural view illustrating a first example of the voltage supply unit 643 illustrated in FIG. 6.

Referring to FIG. 7, the voltage supply unit 700, which is one example of the voltage supply unit 643, may include a voltage controller 720 that outputs a voltage control signal, a register unit 710 that includes a plurality of registers 7111, 7112, . . . , 711x selected by a voltage control signal and each storing voltage data, and a Digital-to-Analog Converter (DAC) 730 that outputs a first voltage V1 or a second voltage V2 corresponding to voltage data stored in a register selected from among the plurality of registers 7111, 7112, . . . , 711x.

The voltage controller 720 may output a voltage control signal when it is determined that the characteristic change period T2 illustrated in FIG. 2 starts. The voltage control signal may be transmitted to the register unit 710 to select one of the plurality of registers 7111, 7112, . . . , 711x. When voltage data stored in the selected register is transmitted to the DAC 730, the DAC 730 may output a first voltage V1 corresponding to the voltage data. The voltage controller 720 may output a voltage control signal again after outputting the first voltage V1. The voltage control signal may be transmitted to the register unit 710 to select another of the plurality of registers 7111, 7112, . . . , 711x. When voltage data stored in the selected register is transmitted to the DAC 730, the DAC 730 may output a second voltage V2 corresponding to the voltage data.

The first voltage V1 and the second voltage V2 output from the DAC 730 may be transmitted to the driver ICs of the data driver, and the driver ICs may transmit the first voltage (V1) and the second voltage (V2) at regular intervals through the second power supply line VL2 illustrated in FIG. 2.

Here, the voltage controller 720 may control the DAC 730 to repeatedly output the first voltage V1 and the second voltage V2 a plurality of times.

FIG. 8 is a structural view illustrating a second example of the voltage supply 643 unit illustrated in FIG. 6.

Referring to FIG. 8, the voltage supply unit 800 is another example of the voltage supply unit 643 of FIG. 6, may include a voltage controller 810 that receives voltage data stored in a lookup table 820 and outputs a voltage control signal corresponding to the voltage data. Here, the voltage control signal output from the voltage controller 810 may include a first voltage control signal and a second voltage control signal that have different voltage data. The first voltage control signal and the second voltage control signal may be output at regular intervals. The voltage control signal may be transmitted to a DAC 830. The DAC 830 may output a first voltage V1 upon receiving the first voltage control signal, and may output a second voltage V2 upon receiving the second voltage control signal.

The voltage supply unit 800 may further include a temperature sensor 810 that outputs temperature information.

However, the present embodiment is not limited thereto, and the temperature sensor 810 may be mounted on the PCB on which the data driver 120 illustrated in FIG. 1 is mounted. The voltage controller 810 receives the temperature information from the temperature sensor 810 and may select voltage data stored in the lookup table 820 according to the temperature information. Accordingly, the voltage supply unit 800 may output a first voltage and a second voltage corresponding to the temperature information. Therefore, the influence of temperature may be reflected. When it is determined based on the temperature information transmitted from the temperature sensor 810 that the temperature is a threshold or higher, the voltage controller 810 may output a first voltage, a second voltage, and a third voltage to more precisely identify a change in digital signal depending on a temperature change, thus more accurately determining a change in first and second characteristics of the ADCs. Therefore, even if the temperature is the threshold or higher, it is possible to cope with a change in characteristic variations of the ADCs.

FIG. 9 is a flowchart illustrating a control method for controlling the display device illustrated in FIG. 1.

Referring to FIG. 9, the control method for controlling the display device is a control method for changing the variations of a plurality of driver ICs transmitting a data signal to a display panel including a plurality of pixels. The driver ICs may each include an ADC, and the variations of the driver ICs may be the output variations of the ADCs.

In the control method, in step S900, a first voltage V1 may be transmitted to the plurality of driver ICs. The plurality of driver ICs may transmit the first voltage V1 through a power supply line. The power supply line may be the second power supply line VL2 illustrated in FIG. 2. The first voltage V1 may be transmitted to each of the ADCs included in the plurality of driver ICs through the power supply line. The ADCs may output a first digital signal corresponding to the first voltage.

In step S910, a first change value of a first characteristic of the plurality of driver ICs may be calculated. The first change value may be a value corresponding to the difference between the first digital signal output from the ADCs of the plurality of driver ICs and a preset first digital signal.

In step S920, a second voltage V2 may be transmitted to the plurality of driver ICs. The second voltage V2 may be transmitted to each of the ADCs included in the plurality of driver ICs through the power supply line. The ADCs may output a second digital signal corresponding to the second voltage V2.

In step S930, a second change value of the first characteristic of the plurality of driver ICs may be calculated. The second change value may be a value corresponding to the difference between the second digital signal output from the ADCs of the plurality of driver ICs and a preset second digital signal. Further, the first change value and the second change value may be calculated by supplying the first voltage V1 and the second voltage V2 a plurality of times.

In step S940, the first characteristic and the second characteristic may be changed using the first change value and the second change value, thereby changing the variations of the plurality of driver ICs. The first change value and the second change value may form the straight line of FIG. 4 by the first voltage and the second voltage, through which the values of the changed first characteristic and second characteristic may be identified, thus changing the first characteristic and the second characteristic.

When the pixels are driven again, the driver ICs operate in accordance with the changed first characteristic and second characteristic, thereby operating so as to compensate for changes in the variations of the ADCs in the driver ICs.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
a display panel;
a data driver including a plurality of driver Integrated Circuits (ICs) configured to supply a data signal to the display panel and to have a first characteristic and a second characteristic corresponding to variations between at least two driver ICs among the plurality of driver ICs; and
a controller configured to:
supply, to the data driver, a first voltage at a first time, the first voltage at a second time, a second voltage at a third time, and the second voltage at a fourth time,
determine a first change value based on a difference between a first output signal of the data driver and a second output signal of the data driver, the first output signal being outputted by the data driver in response to the first voltage at the first time being received by the data driver, the second output signal being outputted by the data driver in response to the first voltage at the second time being received by the data driver,
determine a second change value based on a difference between a third output signal of the data driver and a fourth output signal of the data driver, the third output signal being outputted by the data driver in response to the second voltage at the third time being received by the data driver, the fourth output signal being received by the data driver in response to the second voltage at the fourth time being received by the data driver, and change the first characteristic and the second characteristic based on the first change value and the second change value, wherein a pixel-driving period and a characteristic change period operate separately, a driving current is generated in the pixel-driving period and the controller supplies the first voltage at the first time, the first voltage at the second time, the second voltage at the third time, and the second voltage at the fourth time to the data driver in the characteristic change period.

2. The display device of claim 1, wherein the controller comprises: a voltage supply unit configured to output the first voltage and the second voltage; and a characteristic change unit configured to change the first characteristic and the second characteristic corresponding to the first voltage and the second voltage.

3. The display device of claim 2, wherein the voltage supply unit comprises:
a voltage controller configured to output a voltage control signal;
a register unit including a plurality of registers, each configured to store voltage data, among which one register is selected by the voltage control signal; and
a Digital-to-Analog Converter (DAC) configured to output the first voltage or the second voltage corresponding to voltage data stored in the selected register among the plurality of registers.

4. The display device of claim 2, wherein the voltage supply unit comprises:
a voltage controller configured to receive temperature information from a temperature sensor that is configured to output temperature information, to receive first voltage data and second voltage data respectively corresponding to the first voltage and the second voltage, the first voltage data and the second voltage data being stored in a lookup table and corresponding to the temperature information, and to output voltage control signals respectively corresponding to the first voltage data and the second voltage data; and
an Analog-to-Digital Converter (ADC) configured to sequentially output the first voltage and the second voltage corresponding to the voltage control signals.

5. The display device of claim 4, wherein when it is determined based on the temperature information that a temperature is a threshold or higher, the voltage controller further receives information on third voltage data from the lookup table and outputs voltage control signals respectively corresponding to the first voltage data, the second voltage data, and the third voltage data.

6. The display device of claim 2, wherein the first characteristic and the second characteristic correspond to a predetermined characteristic curve, and the characteristic change unit identifies the change values by detecting a change in the characteristic curve corresponding to the first voltage and the second voltage.

7. The control method of claim 1, wherein the first voltage and the second voltage are supplied from a single voltage supply unit of the controller, and transmitted through at least two power supply lines by the at least two driver ICs.

8. A display device comprising:
a display panel;
a data driver including a plurality of driver Integrated Circuits (ICs) configured to supply a data signal to the display panel, and to have a first characteristic and a second characteristic corresponding to variation between at least two driver ICs among the plurality of driver ICs; and a controller configured to:
supply, to the data driver, a first voltage at a first time, the first voltage at a second time, a second voltage at a third time, and the second voltage at a fourth time,
determine a first change value based on a difference between a first output signal of the data driver and a second output signal of the data driver, the first output signal being outputted by the data driver in response to the first voltage at the first time, the second output signal being outputted by the data driver in response to the first voltage at the second time,
determine a second change value based on a difference between a third output signal of the data driver and a fourth output signal of the data driver, the third output signal being outputted by the data driver in response to the second voltage at the third time, the fourth output signal being received by the data driver in response to the second voltage at the fourth time, and
change the first characteristic and the second characteristic based on the first change value and the second change value,
operate in divided periods of a first detection period for detecting the first change value of the first characteristic and a second detection period for detecting the second change value of the first characteristic, which is performed after the first detection period expires,
wherein a pixel-driving period and a characteristic change period operate separately, a driving current is generated in the pixel-driving period, and the controller operates the first detection period and the second detection period in the characteristic change period.

9. The display device of claim 8, wherein the controller comprises:
a voltage supply unit configured to supply the first voltage to the data driver in the first detection period and to supply the second voltage to the data driver in the second detection period; and
a characteristic change unit configured to identify the first change value and the second change value corresponding to the first voltage and the second voltage and to change and set the first characteristic and the second characteristic using the first change value and the second change value.

10. The display device of claim 9, wherein the voltage supply unit comprises:
a voltage controller configured to output a voltage control signal;
a register unit including a plurality of registers, each configured to store voltage data, among which one register is selected by the voltage control signal; and
a Digital-to-Analog Converter (DAC) configured to output the first voltage or the second voltage corresponding to voltage data stored in the selected register among the plurality of registers.

11. The display device of claim 9, wherein the voltage supply unit comprises: a voltage controller configured to receive temperature information from a temperature sensor configured to output temperature information, to receive first voltage data and second voltage data respectively corresponding to the first voltage and the second voltage, which are stored in a lookup table, corresponding to the temperature information, and to output voltage control signals respectively corresponding to the first voltage data and the second voltage data; and an Analog-to-Digital Converter (ADC) configured to sequentially output the first voltage and the second voltage corresponding to the voltage control signals.

12. The display device of claim 11, wherein when it is determined based on the temperature information that a temperature is a threshold or higher, the voltage controller further receives information on third voltage data from the lookup table and outputs voltage control signals respectively corresponding to the first voltage data, the second voltage data, and the third voltage data.

13. A controller comprising:
 a single voltage supply unit configured to sequentially supply a first voltage and a second voltage to a plurality of driver Integrated Circuits (ICs) when a pixel-driving period expires; and
 a characteristic change unit configured to:
  supply, to the data driver, a first voltage at a first time, the first voltage at a second time, a second voltage at a third time, and the second voltage at a fourth time,
  determine a first change value based on a difference between a first output signal of the data driver and a second output signal of the data driver, the first output signal being outputted by the data driver in response to the first voltage at the first time being received by the data driver, the second output signal being outputted by the data driver in response to the first voltage at the second time being received by the data driver,
  determine a second change value based on a difference between a third output signal of the data driver and a fourth output signal of the data driver, the third output signal being outputted by the data driver in response to the second voltage at the third time being received by the data driver, the fourth output signal being received by the data driver in response to the second voltage at the fourth time being received by the data driver, and
  change the first characteristic and the second characteristic based on the first change value and the second change value,
 wherein a pixel-driving period and a characteristic change period operate separately, and a driving current is generated in the pixel-driving period and the controller supply the first voltage and the second voltage to the data driver in the characteristic change period.

14. The controller of claim 13, wherein the voltage supply unit comprises:
 a voltage controller configured to output a voltage control signal;
 a register unit including a plurality of registers each configured to store voltage data, among which one register is selected by the voltage control signal; and
 a Digital-to-Analog Converter (DAC) configured to output the first voltage or the second voltage corresponding to voltage data stored in the selected register among the plurality of registers.

15. The controller of claim 13, wherein the voltage supply unit comprises: a voltage controller configured to receive temperature information from a temperature sensor configured to output temperature information, to receive first voltage data and second voltage data respectively corresponding to the first voltage and the second voltage, which are stored in a lookup table, corresponding to the temperature information, and to output voltage control signals respectively corresponding to the first voltage data and the second voltage data; and an Analog-to-Digital Converter (ADC) configured to sequentially output the first voltage and the second voltage corresponding to the voltage control signals.

16. The controller of claim 15, wherein when it is determined based on the temperature information that a temperature is a threshold or higher, the voltage controller further receives information on third voltage data from the lookup table and outputs voltage control signals respectively corresponding to the first voltage data, the second voltage data, and the third voltage data.

17. The controller of claim 13, wherein the first characteristic and the second characteristic correspond to a predetermined characteristic curve, and the characteristic change unit identifies the change values by detecting a change in the characteristic curve corresponding to the first voltage and the second voltage.

18. A control method for changing variations of a plurality of driver Integrated Circuits (ICs) that transmits a data signal to a display panel including a plurality of pixels, the control method comprising:
 transmitting a first voltage at a first time and the first voltage at a second time, to the plurality of driver ICs;
 calculating a first change value based on a difference between a first output signal of the data driver and a second output signal of the data driver, the first output signal being outputted by the data driver in response to the first voltage at the first time, the second output signal being outputted by the data driver in response to the first voltage at the second time;
 transmitting a second voltage at a third time, and the second voltage at a fourth time, to the plurality of driver ICs;
 detecting a second change value based on a difference between a third output signal of the data driver and a fourth output signal of the data driver, the third output signal being outputted by the data driver in response to the second voltage at the third time, the fourth output signal being received by the data driver in response to the second voltage at the fourth time; and
 changing and setting the first characteristic and the second characteristic using the first change value and the second change value,
 wherein a pixel-driving period and a characteristic change period operate separately, a driving current is generated in the pixel-driving period and the transmitting the first voltage and the second voltage in the characteristic change period.

19. The control method of claim 18, wherein the changing and setting of the first characteristic and the second characteristic comprises receiving temperature information and changing and setting the first characteristic and the second characteristic in consideration of the temperature information.

20. The control method of claim 18, wherein the plurality of pixels comprises a plurality of transistors, and the first voltage and the second voltage are transmitted to the plurality of driver ICs when the plurality of transistors is turned off.

* * * * *